(12) United States Patent
Nishikawa

(10) Patent No.: US 8,786,112 B2
(45) Date of Patent: *Jul. 22, 2014

(54) LEADFRAME, SEMICONDUCTOR DEVICE, AND METHOD OF MANUFACTURING THE SAME

(71) Applicant: Renesas Electronics Corporation, Kawasaki (JP)

(72) Inventor: Kenji Nishikawa, Kawasaki (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/933,498

(22) Filed: Jul. 2, 2013

(65) Prior Publication Data

US 2013/0285227 A1    Oct. 31, 2013

Related U.S. Application Data

(60) Division of application No. 13/427,777, filed on Mar. 22, 2012, now Pat. No. 8,487,454, and a continuation of application No. 12/458,951, filed on Jul. 28, 2009, now Pat. No. 8,164,203.

(30) Foreign Application Priority Data

Aug. 1, 2008  (JP) .................................. 2008-199186

(51) Int. Cl.
*H01L 23/544* (2006.01)
*H01L 21/00* (2006.01)

(52) U.S. Cl.
USPC .... 257/797; 257/670; 257/777; 257/E23.039; 257/E23.179; 438/109; 438/462

(58) Field of Classification Search
USPC ........... 257/777, 797, E23.179; 438/109, 462
See application file for complete search history.

(56) References Cited

U.S. PATENT DOCUMENTS 6,081,029 A    6/2000 Yamaguchi
6,740,961 B1   5/2004 Mostafazadeh
(Continued)

FOREIGN PATENT DOCUMENTS

JP    56-84360 A    7/1981
JP    58-018948 A   2/1983
(Continued)

OTHER PUBLICATIONS

Japanese Office Action dated Jun. 19, 2012 with English Translation.
(Continued)

*Primary Examiner* — Jasmine Clark
(74) *Attorney, Agent, or Firm* — McGinn IP Law Group, PLLC

(57) ABSTRACT

A semiconductor device includes a die pad including a first surface and a second surface opposite to the first surface, a first chip arranged in a first area on the first surface, the first chip including a first side and a second side crossing to the first side, a second chip arranged in a second area on the first surface, the second chip including a third side and a fourth side crossing to the third side, a plurality of first marks formed on the first surface, the first marks including a third mark and a fourth mark, a plurality of second marks formed on the first surface, the second marks including a fifth mark and sixth mark. The semiconductor device also includes a wire and a resin encapsulating the first chip, the second chip, and the wire.

16 Claims, 8 Drawing Sheets

(56) References Cited

U.S. PATENT DOCUMENTS

| | | |
|---|---|---|
| 6,891,254 B2 | 5/2005 | Taniguchi |
| 6,900,524 B1 | 5/2005 | Minamio et al. |
| 7,262,491 B2 | 8/2007 | Islam et al. |
| 8,178,955 B2 | 5/2012 | Itou et al. |
| 8,487,454 B2 * | 7/2013 | Nishikawa .................... 257/797 |
| 2003/0092216 A1 | 5/2003 | Lee et al. |

FOREIGN PATENT DOCUMENTS

| | | |
|---|---|---|
| JP | 61-85159 | 6/1986 |
| JP | 62-163962 | 10/1987 |
| JP | 2007-134659 A | 5/2007 |
| JP | 2008-124116 A | 5/2008 |

OTHER PUBLICATIONS

Japanese Office Action, dated Sep. 3, 2013 with English translation.

* cited by examiner

LEADFRAME, SEMICONDUCTOR DEVICE, AND METHOD OF MANUFACTURING THE SAME

RELATED APPLICATIONS

This application is a divisional application of U.S. patent application Ser. No. 13/427,777, filed on Mar. 22, 2012, now U.S. Pat. No. 8,487,454 B2, which is a continuation application of U.S. application Ser. No. 12/458,951, filed on Jul. 28, 2009, now U.S. Pat. No. 8,164,203 B2.

This application is based on Japanese patent application No. 2008-199186, the content of which is incorporated hereinto by reference.

BACKGROUND

1. Technical Field

The present invention relates to a leadframe allowing thereon easy confirmation of mounting positions of semiconductor chips, a semiconductor device, and a method of manufacturing a semiconductor device.

2. Related Art

Semiconductor devices, having a semiconductor chip mounted on a leadframe, need mounting of the semiconductor chip with a good positional accuracy. Easy confirmation of a mounting position of the semiconductor chip makes easy screening of defective products.

For example, Japanese Laid-Open Utility Publication No. 62-163962 describes a technique of providing a die island (die pad) with recesses or projections which serve as marks for positioning a semiconductor chip. Japanese Laid-Open Patent Publication No. 2007-134659 discloses a technique of forming trenches on a die pad, and outside a mounting region for a semiconductor chip.

A single leadframe may have a plurality of semiconductor chips mounted thereon. Alternatively, a single type of leadframe may have different types of semiconductor chips respectively mounted thereon, to thereby manufacture several types of semiconductor devices. In these cases, it may be preferable that mounting positions of the plurality of types of semiconductor chips may readily be identified.

SUMMARY

In one embodiment, there is provided a semiconductor device including a die pad including a first surface and a second surface opposite to the first surface, a first chip arranged in a first area on the first surface, the first chip including a first side and a second side crossing to the first side, a second chip arranged in a second area on the first surface, the second chip including a third side and a fourth side crossing to the third side, a plurality of first marks formed on the first surface, the first marks including a third mark and a fourth mark, a plurality of second marks formed on the first surface, the second marks including a fifth mark and sixth mark, a wire, one end of the wire being connected to the first chip, a resin encapsulating the first chip, the second chip, and the wire, a lead, one end of the lead being connected to a second end of the wire, and a part of the lead encapsulated by the resin. The first area is defined as an area surrounded by a first imaginary line, a second imaginary line, a third imaginary line, and a fourth imaginary line in a plan view. The first imaginary line crosses to the third mark and is parallel to the first side of the first chip and the second imaginary line crosses to the third mark and is parallel to the second side of the first chip. The third imaginary line crosses to the fourth mark and is parallel to the first side of the first chip and the fourth imaginary line crosses to the fourth mark and is parallel to the second side of the first chip. The second area is defined as an area surrounded by a fifth imaginary line, a sixth imaginary line, a seventh imaginary line, and an eighth imaginary line in the plan view. The fifth imaginary line crosses to the fifth mark and is parallel to the third side of the second chip. The sixth imaginary line crosses to the fifth mark and is parallel to the fourth side of the second chip. The seventh imaginary line crosses to the sixth mark and is parallel to the third side of the second chip. The eighth imaginary line crosses to the sixth mark and is parallel to the fourth side of the second chip.

In another embodiment, there is provided still also a method of manufacturing a semiconductor device, the method includes mounting at least one of a first semiconductor chip and a second semiconductor chip over a die pad of a leadframe and inspecting a mounting position of at least one of the first semiconductor chip and the second semiconductor chip. The leadframe including a first mark formed to the die pad, for indicating a first mounting region for the first semiconductor chip and a second mark formed to the die pad, for indicating a second mounting region for the second semiconductor chip. The first mark being different from the second mark, in at least either one of size and geometry. In the inspecting a mounting position of at least one of the first semiconductor chip and the second semiconductor chip, a mounting position of the first semiconductor chip is inspected when the first semiconductor chip is mounted, based on a relative position of the first semiconductor chip with respect to the first mark, and a mounting position of the second semiconductor chip is inspected when the second semiconductor chip is mounted, based on a relative position of the second semiconductor chip with respect to the second mark.

According to the present invention, the individual mounting positions of the first semiconductor chip and the second semiconductor chip may readily be identified.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
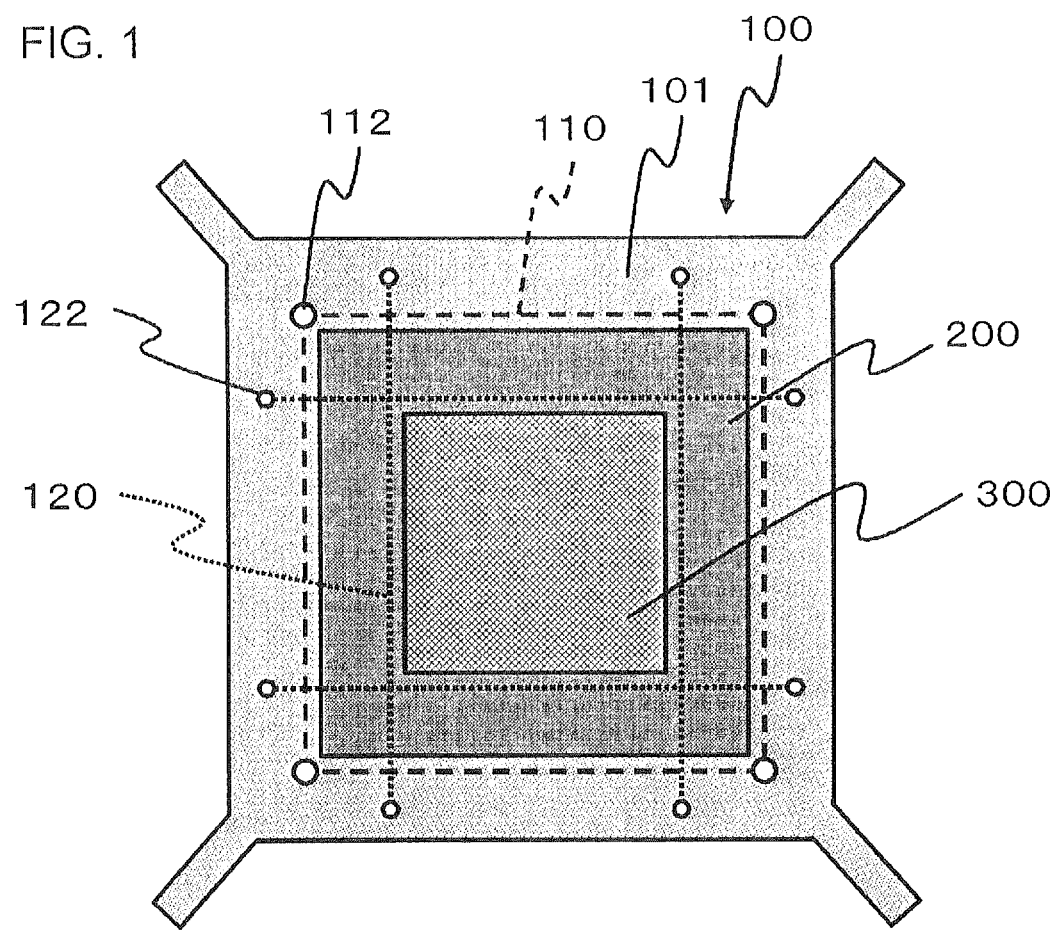
FIG. 1 is a plan view of a semiconductor device according to a first embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that any similar constituents will be given with similar reference numerals or symbols in all drawings, so that explanations therefor will not be repeated.

FIG. 1 is a plan view of a semiconductor device according to a first embodiment. The semiconductor device has a leadframe 100, a first semiconductor chip 200, and a second semiconductor chip 300. The leadframe 100 has a die pad 101, first marks 112, and second marks 122. The die pad 101 allows thereon mounting of the first semiconductor chip 200. The first marks 112 indicate a mounting region 110 for the first semiconductor chip 200, and the second marks 122 indicate a mounting region 120 for the second semiconductor chip 300. The first marks 112 are different from the second marks 122 in at least size and geometry. In this illustrated example, the first mark 112 and the second mark 122 have nearly circular geometry, but have different sizes. More specifically, the first marks 112 are larger than the second marks 122.

Note that first recesses, projections or holes may be adoptable in place of the first marks 112, and second recesses, projections or holes may be adoptable in place of the second marks 122.

The first recesses 112 and the second recesses 122 typically have diameters of equal to or larger than 0.05 mm and equal to or smaller than 0.3 mm, and typically have depths of equal to or deeper than 0.01 mm and equal to or shallower than 0.05 mm. All of the first recesses 112 and the second recesses 122 are positioned outside the mounting region 110 for the first semiconductor chip 200, and outside the mounting region 120 for the second semiconductor chip 300.

In this illustrated example, the second semiconductor chip 300 is smaller than the first semiconductor chip 200, and is mounted over the first semiconductor chip 200. The mounting region 120 for the second semiconductor chip 300 is positioned inside the mounting region 110 for the first semiconductor chip 200.

The die pad 101 has a nearly square or rectangular geometry, and has a plurality of first recesses 112 and a plurality of second recesses 122. The mounting region 110 for the first semiconductor chip 200 is defined by the lines connecting every adjacent first recesses 112. The mounting region 120 for the second semiconductor chip 300 is defined by the lines connecting every correspondent second recesses 122 faced each other through the mounting region 110 for the first semiconductor chip 200 in between.

In this illustrated example, the mounting region 110 for the first semiconductor chip 200 defined by the first recesses 112 is larger than the first semiconductor chip 200, and indicates an allowable range of the mounting position of the first semiconductor chip 200. Also the mounting region 120 for the second semiconductor chip 300 defined by the second recesses 122 is larger than the second semiconductor chip 300, and indicates an allowable range of the mounting position of the second semiconductor chip 300. Alternatively, the mounting region 110 for the first semiconductor chip 200 may have the same geometry with the first semiconductor chip 200, so as to make the mounting region 110 indicate the mounting position of the first semiconductor chip 200 on the design basis. Still alternatively, the mounting region 120 for the second semiconductor chip 300 may have the same geometry with the second semiconductor chip 300, so as to make the mounting region 120 indicate the mounting position of the second semiconductor chip 300 on the design basis.

Figure 2:
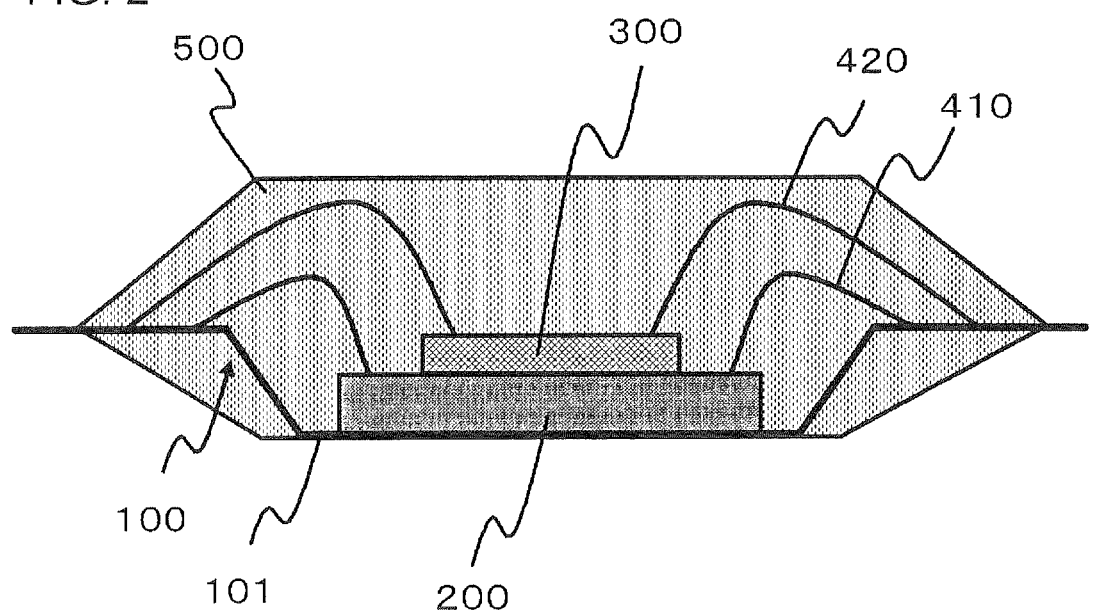
FIG. 2 is a sectional view of the semiconductor device illustrated in FIG. 1.

FIG. 2 is a sectional view of the semiconductor device illustrated in FIG. 1. In addition to the configuration illustrated in FIG. 1, the semiconductor device illustrated in the drawing has wires 410, 420 and an encapsulation resin 500. The wires 410 connect pads (not illustrated) of the first semiconductor chip 200 and inner leads (not illustrated) of the leadframe 100, and the wires 420 connect pads (not illustrated) of the second semiconductor chip 300 and inner leads (not illustrated) of the leadframe 100.

The encapsulation resin 500 encapsulates the surface of the die pad of the leadframe 100, the inner leads, the first semiconductor chip 200, the second semiconductor chip 300, and the wires 410, 420. In this illustrated example, the lower surface of the die pad 101 of the leadframe 100 exposes to the bottom surface of the encapsulation resin 500.

Figure 3:
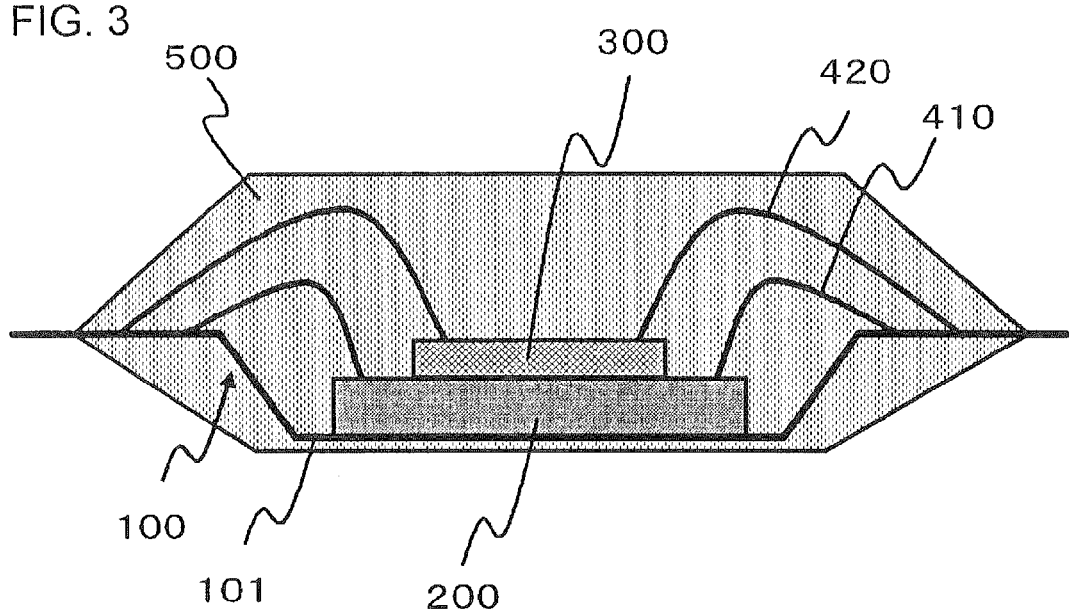
FIG. 3 is a sectional view illustrating a modified example of the semiconductor device illustrated in FIG. 2.

FIG. 3 is a sectional view illustrating a modified example of the semiconductor device illustrated in FIG. 2. The semiconductor device illustrated in the drawing is configured similarly to the semiconductor device illustrated in FIG. 2, except that also the lower surface of the die pad 101 is encapsulated in the encapsulation resin 500.

Paragraphs below will explain a method of manufacturing the semiconductor device illustrated in FIGS. 1 to 3. First, the leadframe 100 is obtained, and the first recesses 112 and the second recesses 122 are formed thereto. The first recesses 112 and the second recesses 122 are formed as impressions, typically by pressing a jig downward against the die pad 101 of the leadframe 100.

For an alternative case where projections are adopted in place of the first recesses 112 and the second recesses 122, the projections are formed as impressions, typically by pressing a jig upward against the die pad 101 of the leadframe 100. For a still alternative case where holes are adopted in place of the first recesses 112 and the second recesses 122, the holes are formed typically by using a punch.

Next, the first semiconductor chip 200 is mounted on the die pad 101, and the second semiconductor chip 300 is further mounted on the first semiconductor chip 200. An apparatus for mounting the first semiconductor chip 200 used herein recognizes the first recesses 112 by image processing or by using a sensor, and determines a mounting position of the first semiconductor chip 200. On the other hand, an apparatus for mounting the second semiconductor chip 300 recognizes the second recesses 122 by image processing or by using a sensor, and determines a mounting position of the second semiconductor chip 300.

Next, the pads of the first semiconductor chip 200 are connected to the inner leads of the leadframe 100 using the wires 410. Furthermore, the pads of the second semiconductor chip 300 are connected to the inner leads of the leadframe 100 using the wires 420.

Next, the mounting position of the first semiconductor chip 200 is visually inspected based on a relative position between the first recesses 112 and the first semiconductor chip 200, and the mounting position of the second semiconductor chip 300 is visually inspected based on a relative position between the second recesses 122 and the second semiconductor chip 300. More specifically, the mounting position of the first semiconductor chip 200 is judged as being correct, if the first semiconductor chip 200 does not fall beyond the mounting region 110 defined by the recesses 112. On the other hand, the mounting position of the second semiconductor chip 300 is judged as being correct, if the second semiconductor chip 300 does not fall beyond the mounting region 120 defined by the second recesses 122.

If both mounting positions of the first semiconductor chip 200 and the second semiconductor chip 300 are judged as being correct, the encapsulation resin 500 is formed using a mold, so as to encapsulate the die pad 101 and the inner leads of the leadframe 100, the first semiconductor chip 200, the second semiconductor chip 300, and the wires 410, 420. For the case where the semiconductor device is configured as illustrated in FIG. 3, and the holes are formed in place of the first recesses 112 and the second recesses 122, the encapsulation resin 500 intrudes also in the holes, to thereby improve adhesiveness between the encapsulation resin 500 and the leadframe 100.

Next, operations and effect of this embodiment will be explained. The first recesses 112 indicate the mounting region 110 for the first semiconductor chip 200, and the second recesses 122 indicate the mounting region 120 for the second semiconductor chip 300. The first recesses 112 and the second recesses 122 are different from each other in at least either one of size and geometry. Accordingly, the mounting region 110 for the first semiconductor chip 200 and the mounting region 120 for the second semiconductor chip 300 may readily be recognized, in whatever cases of adopting the image processing, the sensor and visual inspection.

More specifically, the apparatus for mounting the semiconductor chip onto the die pad 101 may readily recognize the mounting region 110 for the first semiconductor chip 200, and the mounting region 120 for the second semiconductor chip 300. Also for the case where the mounting position of each of the first semiconductor chip 200 and the second semiconductor chip 300 is visually inspected, each of the mounting region 110 for the first semiconductor chip 200 and the mounting region 120 for the second semiconductor chip 300 may readily be recognized.

The first recesses 112 and the second recesses 122 may be formed simply by pressing a jig against the die pad 101, needing only a low cost for forming the first recesses 112 and the second recesses 122.

The first recesses 112 and the second recesses 122, provided so as not to extend through the die pad 101, are contributive to suppress decrease in the strength of the die pad 101, and also to suppress the flatness of the die pad 101 from degrading.

Alternatively by using only a single type of leadframe 100, a first semiconductor device having only the first semiconductor chip 200 mounted on the die pad 101, and a second semiconductor device having only the second semiconductor chip 300 mounted on the die pad 101 may be manufactured. In this way, only a single type of leadframe 100 may be used commonly for the first and second semiconductor devices having different chip sizes. The above-described effects may be obtained also in this case.

Figure 4:
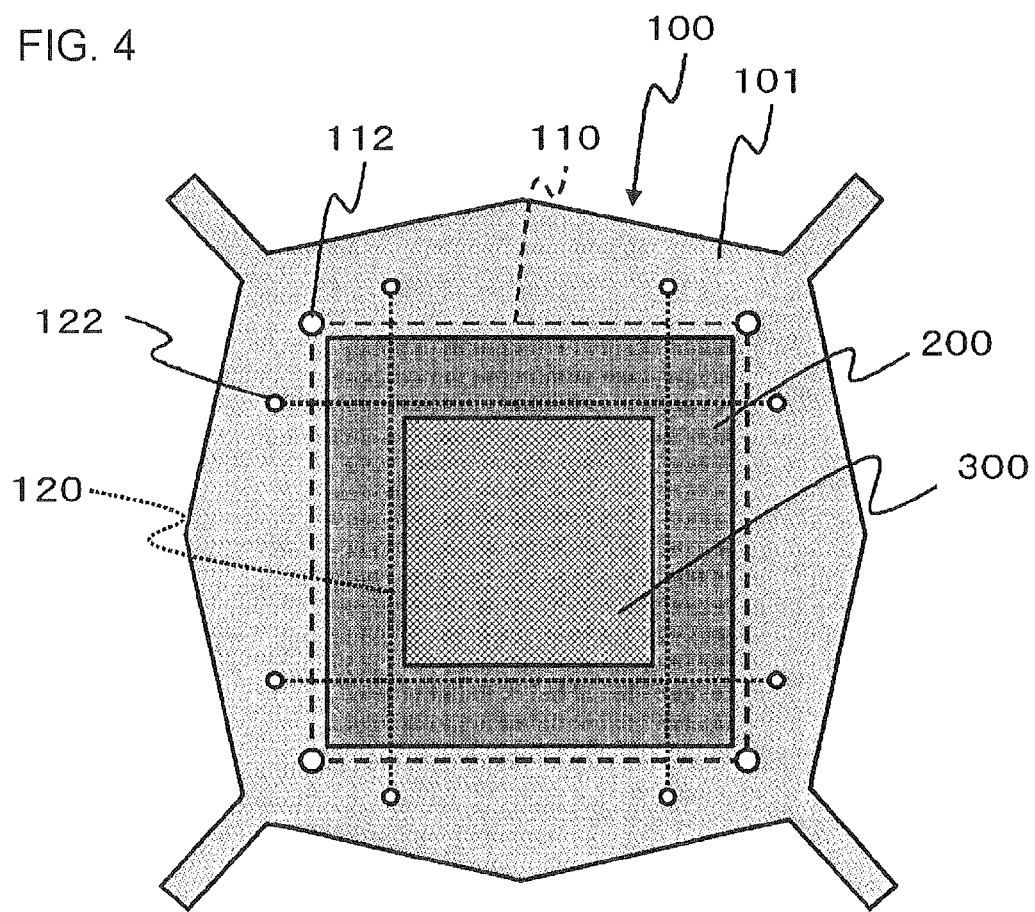
FIG. 4 is a plan view of a semiconductor device according to a second embodiment.

FIG. 4 is a plan view of a semiconductor device according to a second embodiment, and corresponds to FIG. 1 in the first embodiment. The semiconductor device is configured similarly to the semiconductor device explained in the first embodiment, except for the planar geometry of the die pad 101. The die pad 101 of this embodiment has a nearly octagonal geometry.

For the case where the die pad 101 has a non-simple geometry just like this embodiment, it may not be easy to recognize the distance from the edges of the die pad 101 to the first semiconductor chip 200 and to the second semiconductor chip 300. It may therefore be difficult to inspect the mounting position of the first semiconductor chip 200 and the second semiconductor chip 300, based on the distance from the edges of the die pad 101. In contrast in this embodiment, the mounting region 110 for the first semiconductor chip 200 is defined by the first recesses 112, and the mounting region 120 for the second semiconductor chip 300 is defined by the second recesses 122. The mounting positions of the first semiconductor chip 200 and the second semiconductor chip 300 may readily be inspected.

Figure 5:
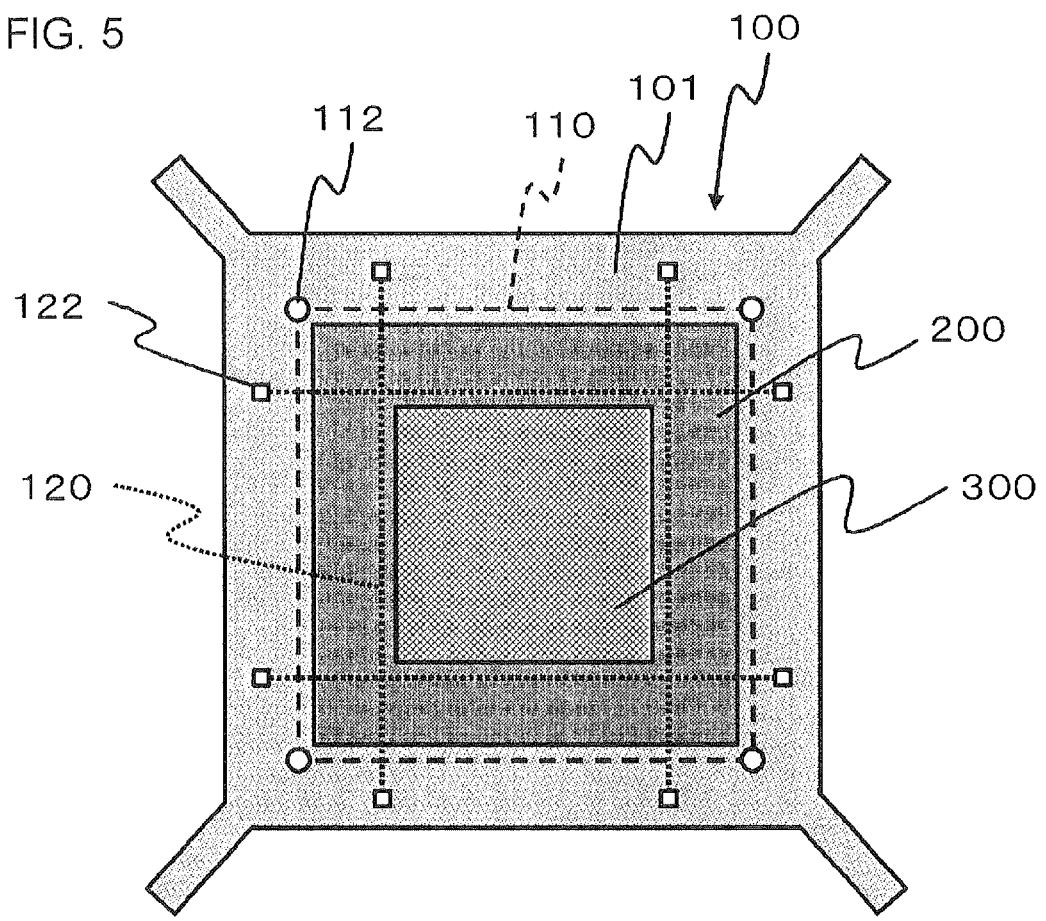
FIG. 5 is a plan view of a semiconductor device according to a third embodiment.

FIG. 5 is a plan view of a semiconductor device according to a third embodiment, and corresponds to FIG. 1 in the first embodiment. The semiconductor device is configured similarly to the semiconductor device explained in the first embodiment, except that the first recesses 112 and the second recesses 122 have different geometries.

The effects similar to those in the first embodiment may be obtained also in this embodiment. Since the first recesses 112 and the second recesses 122 may be formed to have the same size, both of the first recesses 112 and the second recesses 122 may more readily be confirmed by visual inspection.

Figure 6:
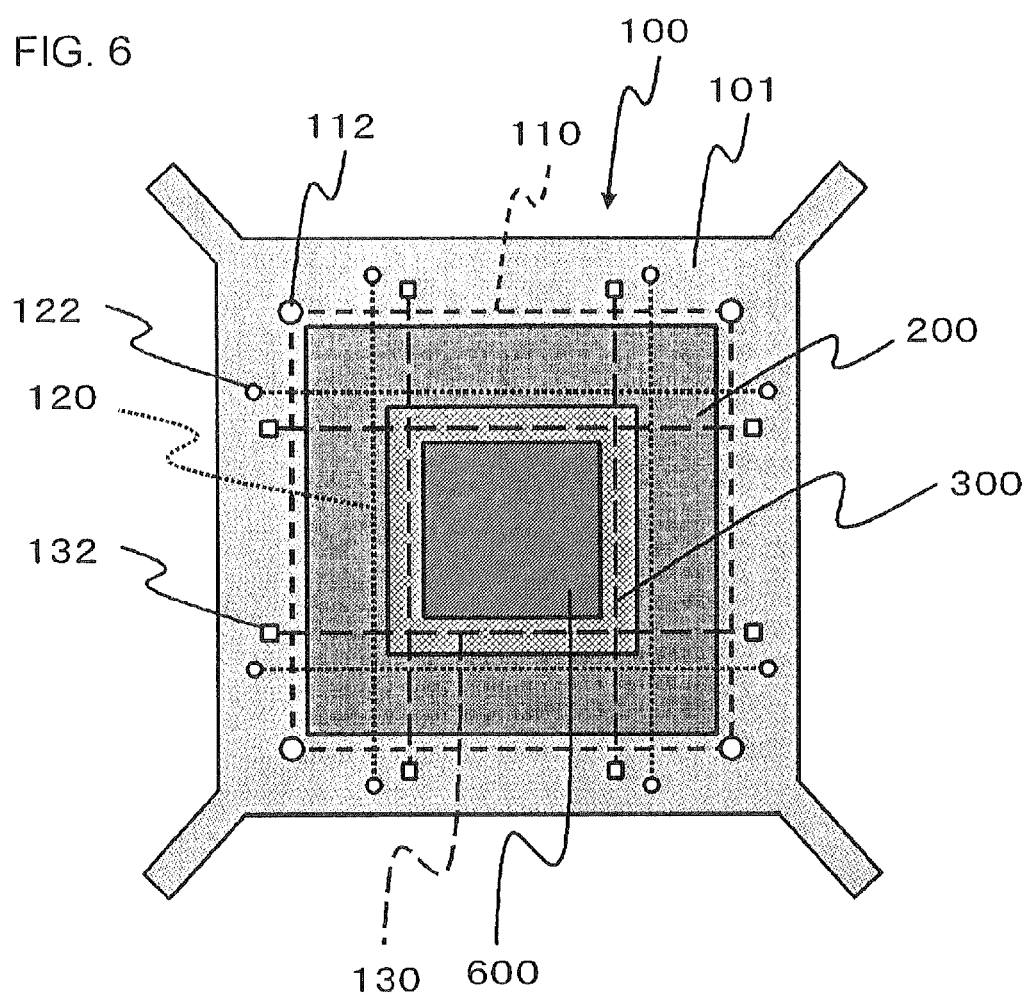
FIG. 6 is a plan view of a semiconductor device according to a fourth embodiment.

FIG. 6 is a plan view of a semiconductor device according to a fourth embodiment, and corresponds to FIG. 1 in the first embodiment. The semiconductor device is configured similarly to the semiconductor device explained in the first embodiment, except that a third semiconductor chip 600 is mounted over the second semiconductor chip 300, and that a plurality of third recesses 132 are formed to the die pad 101. The third recesses 132 may be formed in the same step of forming the first recesses 112 and the second recesses 122.

The third semiconductor chip 600 is smaller than the second semiconductor chip 300. The third recesses 132 are different from both of the first recesses 112 and the second recesses 122, in at least either one of size and geometry. The plurality of third recesses 132 indicate a mounting region 130 for the third semiconductor chip 600. The mounting region 130 is defined by the lines connecting the correspondent third recesses 132 faced each other through the mounting region 120 for the second semiconductor chip 300 in between.

Effects similar to those in the first embodiment may be obtained also in this embodiment. Also mounting and inspection of the mounting position of the third semiconductor chip 600 may be carried out similarly to the mounting and inspection of the mounting positions of the first semiconductor chip 200 and the second semiconductor chip 300.

Figure 7:
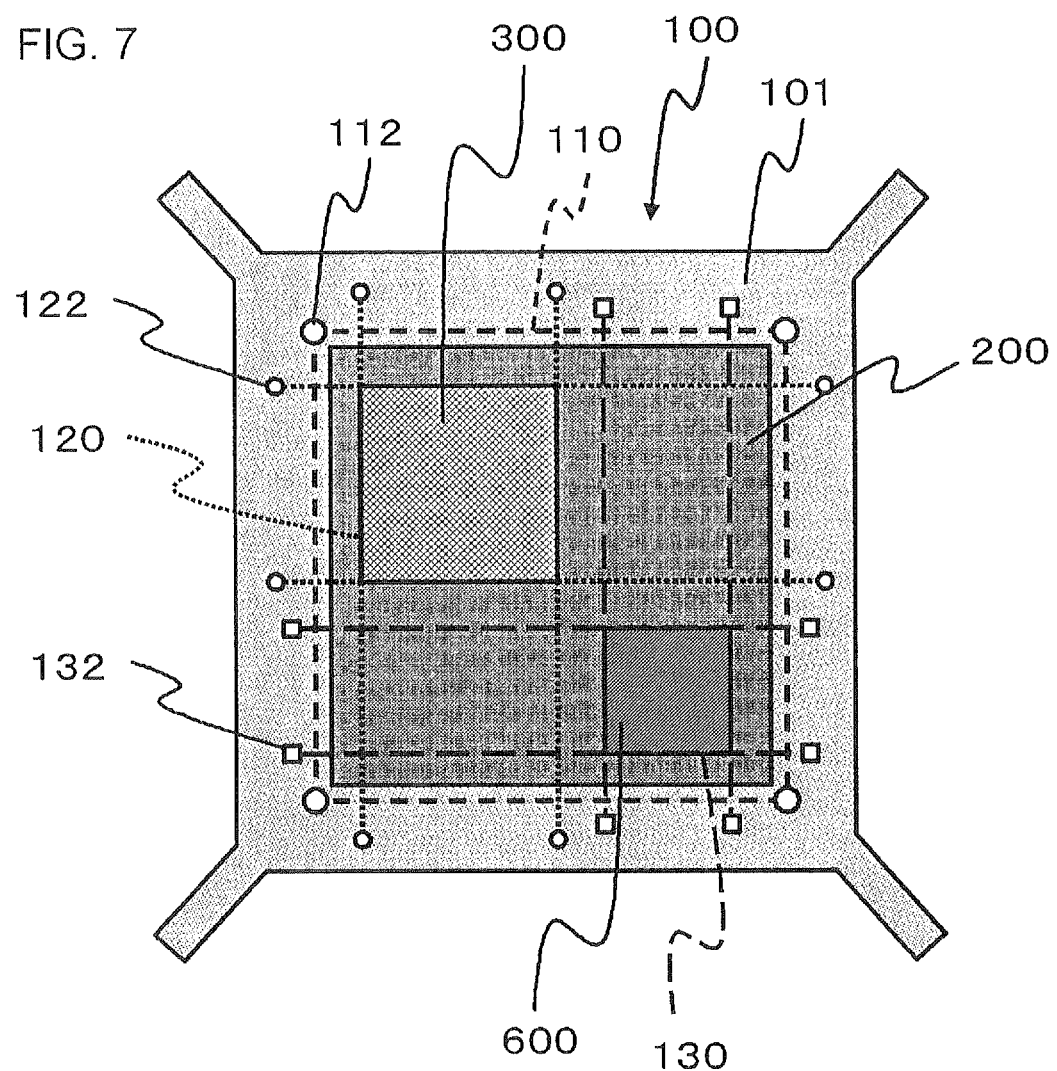
FIG. 7 is a plan view of a semiconductor device according to a fifth embodiment.

FIG. 7 is a plan view of a semiconductor device according to a fifth embodiment, and corresponds to FIG. 6 in the fourth embodiment. The semiconductor device is configured similarly to as described in the fourth embodiment, except that both of the second semiconductor chip 300 and the third semiconductor chip 600 are mounted over the first semiconductor chip 200.

Effects similar to those in the fourth embodiment may be obtained also in this embodiment.

Figure 8:
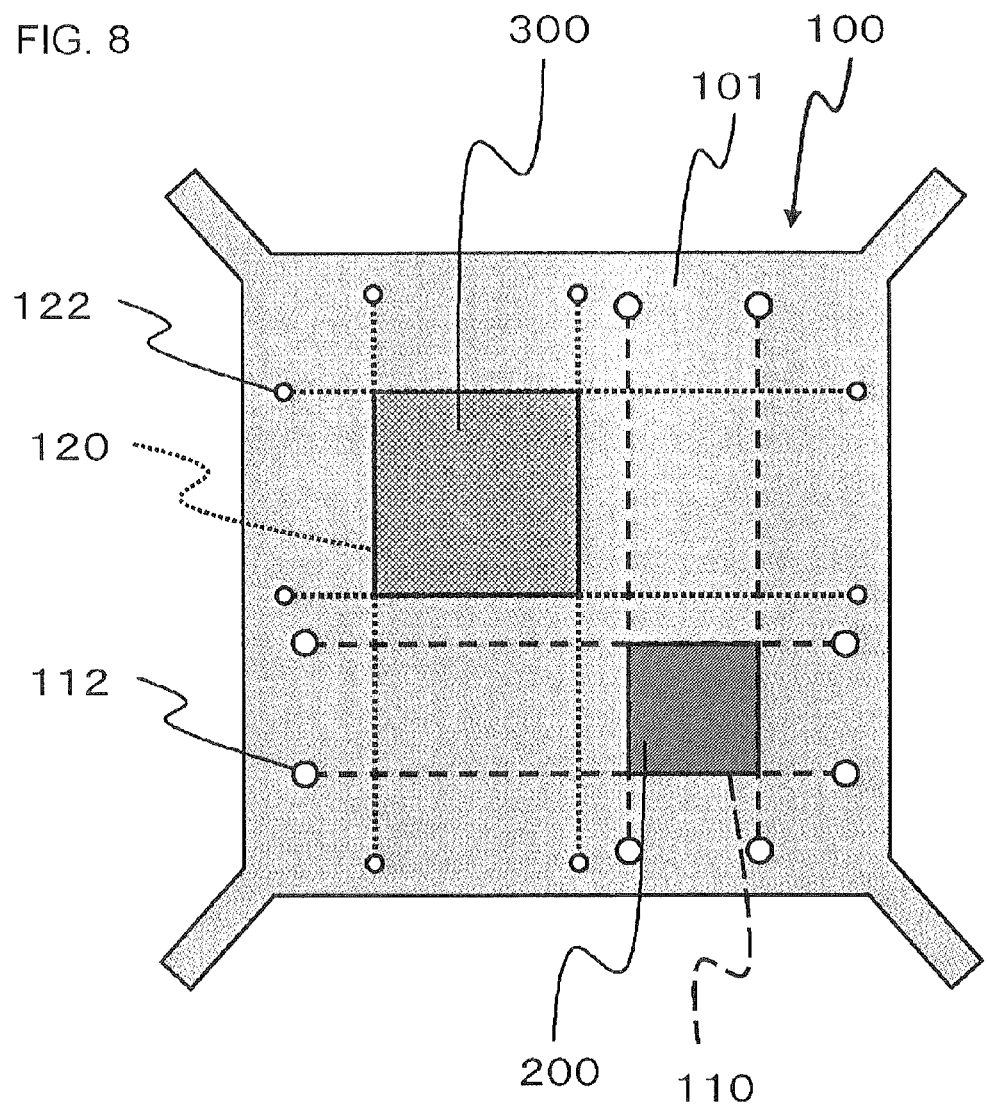
FIG. 8 is a plan view of a semiconductor device according to a sixth embodiment.

FIG. 8 is a plan view of a semiconductor device according to a sixth embodiment, and corresponds to FIG. 1 in the first embodiment. The semiconductor device is configured similarly to as described in the first embodiment, except that the second semiconductor chip 300 is mounted on the die pad 101 of the leadframe 100, rather than on the first semiconductor chip 200.

Effects similar to those in the first embodiment may be obtained also in this embodiment.

Figure 9:
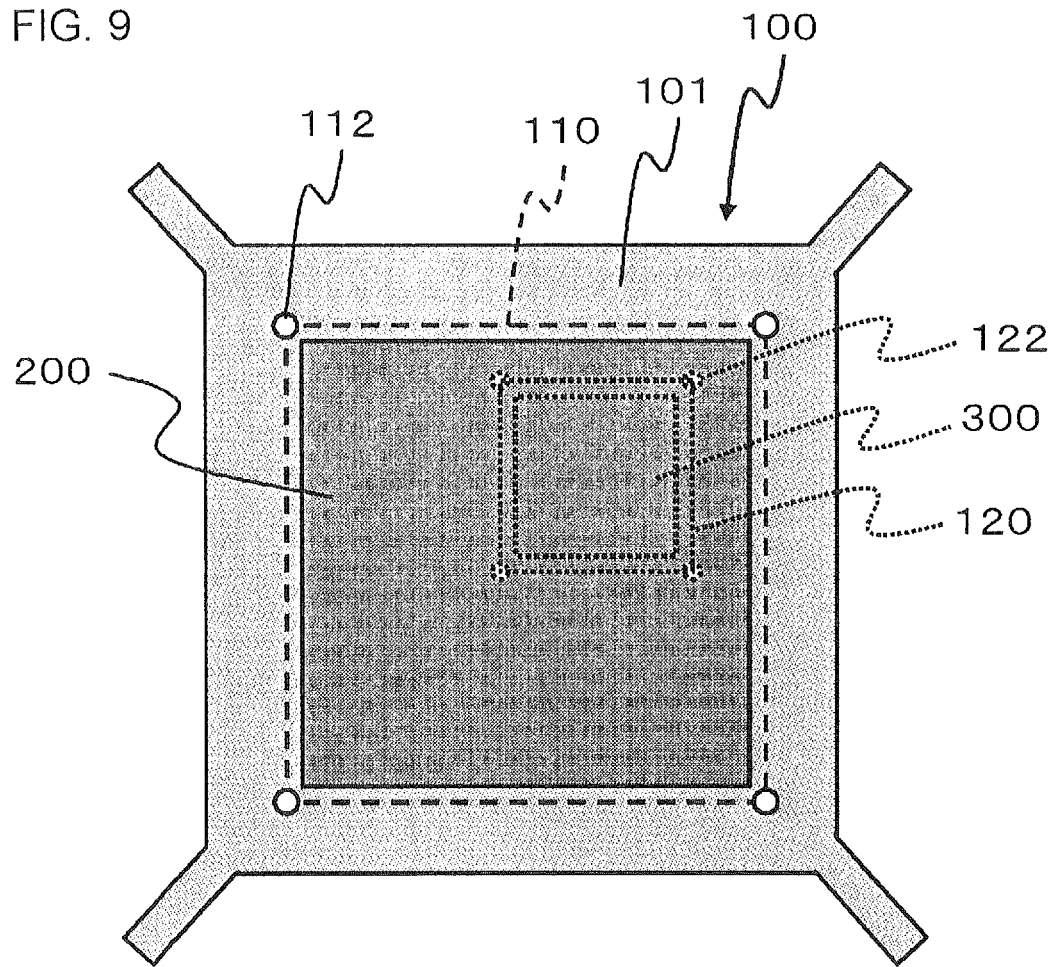
FIG. 9 is a plan view of a semiconductor device according to a seventh embodiment.
Figure 10:
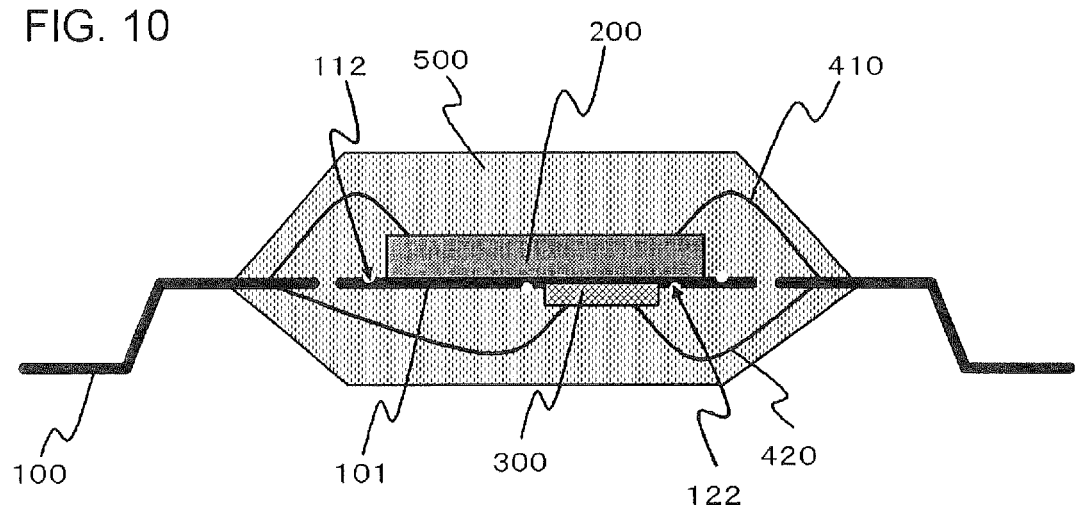
FIG. 10 is a sectional view of the semiconductor device illustrated in FIG. 9.

FIG. 9 is a plan view of a semiconductor device according to a seventh embodiment, and FIG. 10 is a schematic sectional view of the semiconductor device illustrated in FIG. 9. The semiconductor device is configured similarly to as described in the first embodiment, except for the aspects below. First, the first semiconductor chip 200 is mounted on a first surface of the die pad 101 of the leadframe 100, and the second semiconductor chip 300 is mounted on a second surface, which is the surface opposite to the first surface, of the die pad 101. The first recesses 112 are formed to the first surface of the die pad 101, and the second recesses 122 are formed to the second surface of the die pad 101.

According to this embodiment, the first recesses 112 formed to the first surface of the die pad 101 are different from the second recesses 122 formed to the second surface of the die pad 101, in at least either one of size and geometry. Accordingly, the surface to be mounted thereon with the first semiconductor chip 200, and the surface to be mounted thereon with the second semiconductor chip 300 may readily be understood in a respective manner. Therefore, the mounting surface for the first semiconductor chip 200 and the mounting surface for the second semiconductor chip 300 may be less likely to be mistaken.

Figure 11:
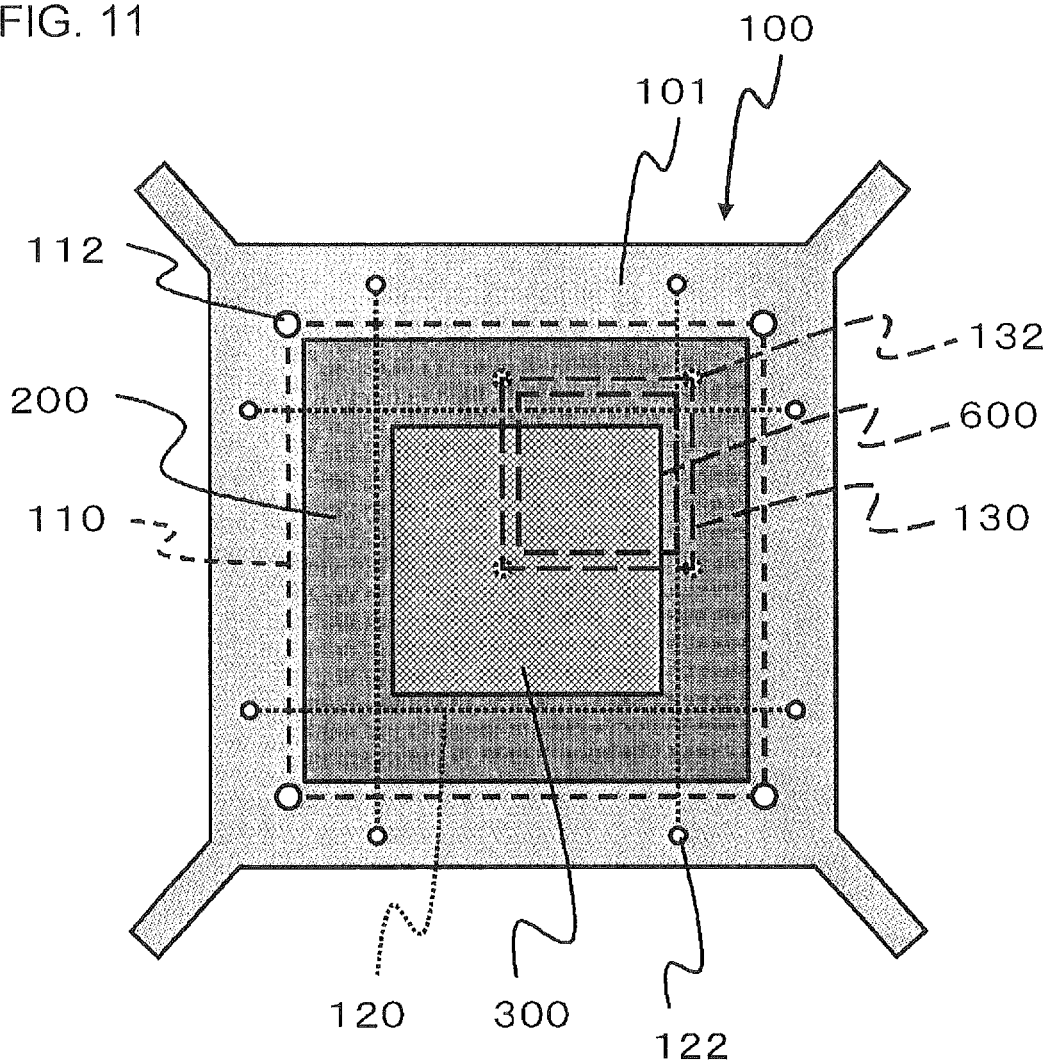
FIG. 11 is a plan view of a semiconductor device according to an eighth embodiment.
Figure 12:
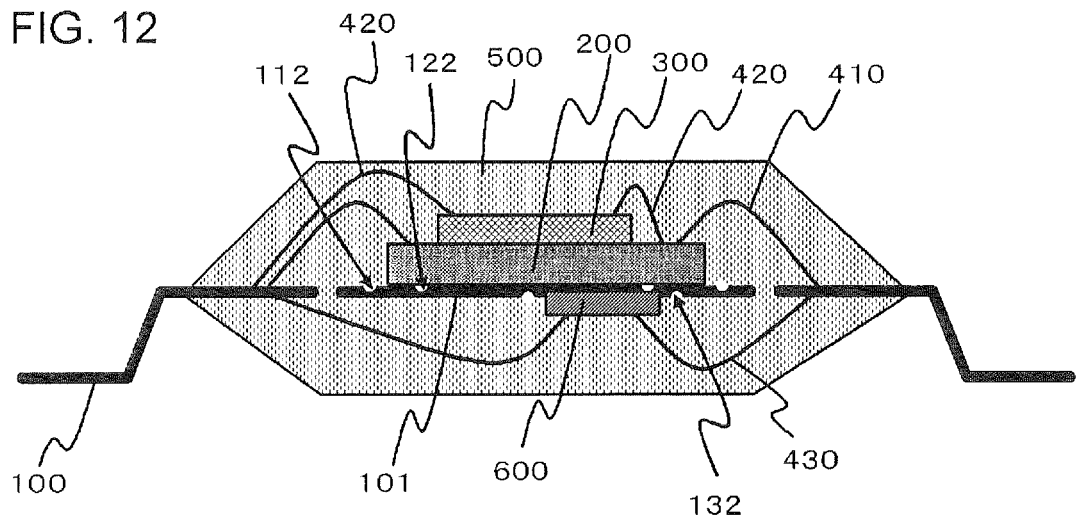
FIG. 12 is a sectional view of the semiconductor device illustrated in FIG. 11.

FIG. 11 is a plan view of a semiconductor device according to an eighth embodiment, and FIG. 12 is a schematic sectional view of the semiconductor device illustrated in FIG. 11. The semiconductor device is configured similarly to as described in the fourth embodiment, except for the aspects below. First, the first surface of the die pad 101 of the leadframe 100 has the first semiconductor chip 200 and the second semiconductor chip 300 mounted thereon. The second surface of the die pad 101, which is the surface opposite to the first surface, has the third semiconductor chip 600 mounted thereon. The first surface of the die pad 101 has also the first recesses 112 and the second recesses 122 formed thereto, and the second surface of the die pad 101 has the third recess 132 formed thereto.

As illustrated in FIG. 12, the second semiconductor chip 300 in this embodiment is directly connected to the leadframe 100 through a part of the wires 420, and connected to the first semiconductor chip 200 through the residual wires 420. The third semiconductor chip 600 is directly connected to the leadframe 100 through wires 430.

Effects similar to those in the fourth embodiment may be obtained also in this embodiment. The first recesses 112 and the second recesses 122 formed to the first surface of the die pad 101 are different from the third recesses 132 formed to the second surface of the die pad 101, in at least either one of size and geometry. Accordingly, the surface to be mounted thereon with the first semiconductor chip 200 and the second semiconductor chip 300, and the surface to be mounted thereon with the third semiconductor chip 600 may readily be recognized in a respective manner. Therefore, the mounting surface for the first semiconductor chip 200 and the second semiconductor chip 300, and the mounting surface for the second semiconductor chip 300 may be less likely to be mistaken.

In the seventh embodiment, the first recesses 112 and the second recesses 122 may have the same geometry and the same size. In the eighth embodiment, the third recesses 132 may have the same size and the same geometry with the first recesses 112 or the second recesses 122.

The embodiments of the present invention have been explained referring to the attached drawings, merely as examples of the present invention, while allowing adoption of various configurations other than those described in the above.

It is apparent that the present invention is not limited to the above embodiments, but may be modified and changed without departing from the scope and spirit of the invention.

What is claimed is:

1. A semiconductor device, comprising:
   a die pad comprising a first surface and a second surface opposite to the first surface;
   a first chip arranged in a first area on the first surface, the first chip comprising a first side and a second side crossing to the first side;
   a second chip arranged in a second area on the first surface, the second chip comprising a third side and a fourth side crossing to the third side;
   a plurality of first marks formed on the first surface, the first marks comprising a third mark and a fourth mark;
   a plurality of second marks formed on the first surface, the second marks comprising a fifth mark and sixth mark;
   a wire, one end of the wire connected to the first chip;
   a resin encapsulating the first chip, the second chip, and the wire;
   a lead, one end of the lead connected to a second end of the wire, and a part of the lead encapsulated by the resin,
   wherein the first area is defined as an area surrounded by a first imaginary line, a second imaginary line, a third imaginary line, and a fourth imaginary line in a plan view,
   wherein the first imaginary line crosses to the third mark and is parallel to the first side of the first chip,
   wherein the second imaginary line crosses to the third mark and is parallel to the second side of the first chip,
   wherein the third imaginary line crosses to the fourth mark and is parallel to the first side of the first chip,
   wherein the fourth imaginary line crosses to the fourth mark and is parallel to the second side of the first chip,
   wherein the second area is defined as an area surrounded by a fifth imaginary line, a sixth imaginary line, a seventh imaginary line, and a eighth imaginary line in the plan view,
   wherein the fifth imaginary line crosses to the fifth mark and is parallel to the third side of the second chip,
   wherein the sixth imaginary line crosses to the fifth mark and is parallel to the fourth side of the second chip,
   wherein the seventh imaginary line crosses to the sixth mark and is parallel to the third side of the second chip, and
   wherein the eighth imaginary line crosses to the sixth mark and is parallel to the fourth side of the second chip.

2. The semiconductor device according to claim 1, wherein the first area is larger than the second area in the plan view.

3. The semiconductor device according to claim 1, wherein the second surface of the die pad is exposed from the resin.

4. The semiconductor device according to claim 1, wherein the first mark comprises one of a recess, a projection, and a hole, and
   wherein the second mark comprises one of a recess, a projection, and a hole.

5. The semiconductor device according to claim 1, wherein the second semiconductor chip is smaller than the first semiconductor chip in the plan view.

6. The semiconductor device according to claim 1, wherein the first mark is positioned between the first semiconductor chip and edges of the die pad, and
   wherein the second mark is positioned between the second semiconductor chip and said edges of the die pad.

7. The semiconductor device according to claim 1, wherein one of the plurality of first marks comprises a circle in the plan view.

8. The semiconductor device according to claim 1, wherein one of the plurality of second marks comprises a circle in the plan view.

9. The semiconductor device according to claim 1, wherein the die pad comprises an octagon in the plan view.

10. The semiconductor device according to claim 1, wherein the first area does not overlap the second area in the plan view.

11. The semiconductor device according to claim 1, wherein the first chip and the second chip do not overlap each other.

12. The semiconductor device according to claim 1, wherein the first side of the first chip is parallel to the third side of the second chip.

13. The semiconductor device according to claim 1, wherein the second side of the first chip is parallel to the fourth side of the second chip.

14. The semiconductor device according to claim 1, wherein the plurality of second mark are different from the plurality of the first mark in at least one of size and geometry.

15. The semiconductor device according to claim 1, wherein the first area overlaps the second area in the plan view.

16. The semiconductor device according to claim 1, wherein the first chip and the second chip overlap each other.

* * * * *